(12) United States Patent
Cheah et al.

(10) Patent No.: US 9,136,251 B2
(45) Date of Patent: Sep. 15, 2015

(54) METHOD TO ENABLE CONTROLLED SIDE CHIP INTERCONNECTION FOR 3D INTEGRATED PACKAGING SYSTEM

(75) Inventors: Bok Eng Cheah, Bayan Lepas (MY); Shanggar Periaman, Penang (MY); Kooi Chi Ooi, Bayan Lepas (MY); Jackson Chung Peng Kong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 13/997,041

(22) PCT Filed: Jun. 25, 2012

(86) PCT No.: PCT/MY2012/000191
§ 371 (c)(1),
(2), (4) Date: Jun. 21, 2013

(87) PCT Pub. No.: WO2014/003533
PCT Pub. Date: Jan. 3, 2014

(65) Prior Publication Data
US 2013/0341803 A1 Dec. 26, 2013

(51) Int. Cl.
*H01L 23/48* (2006.01)
*H01L 23/52* (2006.01)
(Continued)

(52) U.S. Cl.
CPC ............ *H01L 25/0657* (2013.01); *H01L 24/05* (2013.01); *H01L 24/06* (2013.01);
(Continued)

(58) Field of Classification Search
CPC .............. H01L 25/06557; H01L 24/06; H01L 25/0652; H01L 24/05; H01L 25/50; H01L 24/17; H01L 2924/00014; H01L 2924/1461; H01L 2225/06517; H01L 24/73; H01L 2224/0557; H01L 2225/06524; H01L 2224/1703; H01L 2224/16225; H01L 2224/17183; H01L 24/32; H01L 2924/1434; H01L 2924/1432; H01L 2924/10253; H01L 2224/16145; H01L 2224/17181; H01L 24/80; H01L 24/81; H01L 2225/06551; H01L 2224/02371; H01L 2224/94; H01L 2224/131; H01L 2924/15311; H01L 2224/81815; H01L 23/3128; H01L 23/22; H01L 24/73204; H01L 2224/02372; H01L 2224/80894; H01L 24/13; H01L 2225/06513; H01L 2224/06183; H01L 24/16; H01L 2224/73204; H01L 2224/32225; H01L 2924/00012; H01L 2224/34; H01L 2224/80; H01L 2924/014; H01L 2924/73204; H01L 2924/00; H01L 2224/05552

See application file for complete search history.

(56) References Cited

U.S. PATENT DOCUMENTS

2007/0096263 A1* 5/2007 Furukawa et al. ............ 257/621
2008/0303031 A1 12/2008 Toh et al.
(Continued)

FOREIGN PATENT DOCUMENTS

| JP | 2002368348 | 12/2002 |
| KR | 20100038220 | 4/2010 |
| KR | 20110123038 | 11/2011 |

OTHER PUBLICATIONS

International Search Report and Written Opinion for PCT Patent Application No. PCT/MY2012/000191 Mailed Mar. 4, 2013, 12 pages.

*Primary Examiner* — Victor A Mandala
(74) *Attorney, Agent, or Firm* — Blakely, Sokoloff, Taylor & Zafman LLP (57) ABSTRACT

Semiconductor multi-die structures having intermediate vertical side chips, and packages housing such semiconductor multi-die structures, are described. In an example, a multi-die semiconductor structure includes a first main stacked dies (MSD) structure having a first substantially horizontal arrangement of semiconductor dies. A second MSD structure having a second substantially horizontal arrangement of semiconductor dies is also included. An intermediate vertical side chip (i-VSC) is disposed between and electrically coupled to the first and second MSD structures.

30 Claims, 8 Drawing Sheets

(51) Int. Cl.
*H01L 29/40* (2006.01)
*H01L 25/065* (2006.01)
*H01L 23/00* (2006.01)
*H01L 25/00* (2006.01)
*H01L 23/31* (2006.01)

(52) U.S. Cl.
CPC ........... *H01L 24/17* (2013.01); *H01L 25/0652* (2013.01); *H01L 25/50* (2013.01); *H01L 23/3128* (2013.01); *H01L 24/13* (2013.01); *H01L 24/16* (2013.01); *H01L 24/32* (2013.01); *H01L 24/73* (2013.01); *H01L 24/80* (2013.01); *H01L 24/81* (2013.01); *H01L 2224/02371* (2013.01); *H01L 2224/02372* (2013.01); *H01L 2224/0401* (2013.01); *H01L 2224/0557* (2013.01); *H01L 2224/06181* (2013.01); *H01L 2224/06183* (2013.01); *H01L 2224/06517* (2013.01); *H01L 2224/131* (2013.01); *H01L 2224/16137* (2013.01); *H01L 2224/16145* (2013.01); *H01L 2224/16225* (2013.01); *H01L 2224/1703* (2013.01); *H01L 2224/17181* (2013.01); *H01L 2224/17183* (2013.01); *H01L 2224/32225* (2013.01); *H01L 2224/73204* (2013.01); *H01L 2224/80894* (2013.01); *H01L 2224/81815* (2013.01); *H01L 2224/94* (2013.01); *H01L 2225/06513* (2013.01); *H01L 2225/06524* (2013.01); *H01L 2225/06541* (2013.01); *H01L 2225/06551* (2013.01); *H01L 2225/06562* (2013.01); *H01L 2225/06565* (2013.01); *H01L 2924/00014* (2013.01); *H01L 2924/10253* (2013.01); *H01L 2924/1432* (2013.01); *H01L 2924/1434* (2013.01); *H01L 2924/1461* (2013.01); *H01L 2924/15311* (2013.01); *H01L 2924/18161* (2013.01)

(56) References Cited

U.S. PATENT DOCUMENTS

| | | | | |
|---|---|---|---|---|
| 2008/0315388 | A1* | 12/2008 | Periaman et al. | 257/690 |
| 2010/0181679 | A1 | 7/2010 | Baleras et al. | |
| 2011/0018120 | A1* | 1/2011 | Drost et al. | 257/692 |
| 2012/0051695 | A1* | 3/2012 | Harada et al. | 385/39 |
| 2012/0056327 | A1* | 3/2012 | Harada et al. | 257/773 |
| 2012/0233510 | A1* | 9/2012 | Colgan et al. | 714/700 |
| 2013/0075915 | A1* | 3/2013 | Kim et al. | 257/773 |

* cited by examiner

METHOD TO ENABLE CONTROLLED SIDE CHIP INTERCONNECTION FOR 3D INTEGRATED PACKAGING SYSTEM

CLAIM OF PRIORITY

This application is a U.S. National Phase application under 35 U.S.C. §371 of International Application No. PCT/MY2012/000191, filed Jun. 25, 2012, entitled "METHOD TO ENABLE CONTROLLED SIDE CHIP INTERCONNECTION FOR 3D INTEGRATED PACKAGING SYSTEM," the entire contents of which are incorporated herein by reference.

TECHNICAL FIELD

Embodiments of the invention are in the field of semiconductor packages and, in particular, multi-die semiconductor structures with intermediate vertical side chips and semiconductor packages for housing such multi-die semiconductor structures.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

On the other hand, although scaling is typically viewed as a reduction in size, the inclusion of additional semiconductor die a given space is also considered. However, structural issues may arise when attempting to package multiple semiconductor dies in a same package. For example, the addition of multiple stacks of die may add functionality, but ever decreasing space availability in a semiconductor package may provide obstacles to adding such functionality.

DESCRIPTION OF THE EMBODIMENTS

Multi-die semiconductor structures with intermediate vertical side chips and semiconductor packages for housing such multi-die semiconductor structures are described. In the following description, numerous specific details are set forth, such as die arrangement and packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches for enabling controlled side chip interconnection for three-dimensional (3D) integrated packaging systems. For example, in one embodiment, multi-die arrangements (e.g., multi-chip packaging, or MCP) may be used for fabricating 3D cube processors and system-in-package (SIP) Technologies. In one embodiment, a controlled side chip collapse is performed for assembly of a multi-die structure.

Embodiments of the present invention include fabrication of an integrated packaging system through vertical side chip (VSC) interconnection, as described in greater detail below. The VSC interconnection may allow for one or multiple silicon device(s) to be attached at a side of a main silicon die or multiple stacked-dies to form a high functionality and compact integrated system. Such systems may be useful for next generation ultra-mobile digital applications, e.g., mobile internet devices (MIDs), personal digital assistants (PDAs), smart-phones, and digital cameras. In an embodiment, a fabrication method and process flow for forming a die side pad (DSP) to enable the vertical side chip interconnection is provided, as is also described in greater detail below.

More generally, extensive platform or motherboard space may be required to integrate various functional devices, e.g., CPU, chipset, memory, sensor, optical, MEMS through the use of multiple packages. Integration of various functional devices has been addressed by 3D and system-in-package design technologies, e.g., mixed-stacked packages, 3D-stacked packages, and package-on-package (POP) technologies. However, constraints may exist on package form factor and dimension with the requirements of high I/O density, increased device functionality and integration complexity. Additionally, there may be minimum I/O reception for upper or top portion device(s) in 3D stacked configurations with both conventional wire-bonding as well as more recent applications of through silicon via (TSV) technologies. Furthermore, thermal stresses on bottom device(s) in 3D stacked die package may be an undesirable consequence from using TSV technology. Current TSV design typically requires the bottom die to channel the entire power source to the stacked silicon dies, leading to possible further constraints.

By contrast, in accordance with one or more embodiments of the present invention, one or more vertical side chips is used in a multi-die structure to significantly increase I/O pin density and additional electrical paths to the silicon devices within a main stacked die (MSD) through direct linkage or channel, e.g., through use of one or more of a die side pad (DSP), solder/metal connection, die backside metallization (DBM), surface activated bonding (SAB) and TSV technologies. Such approaches may enable the integration of multiple devices, e.g., the integration of one or more of CPUs, netcom/application/graphic processors, chipsets, memory flash, etc. into one single package. In one embodiment, then, further miniaturization of motherboard system and overall form factor is enabled. In one or more embodiments, 3D stacked integration described herein further enables direct communication and short interlink between functional devices, e.g., CPU to chipset communication, or CPU to memory flash. Communication speed and efficiency may thus be improved amongst functional devices within a system. In one embodiment, structural arrangements described herein provide additional heat dissipation channels from stacked silicon devices in an MSD to an external system through peripheral VSCs. Heat dissipation through a package cooling system may further be enhanced by, e.g., direct air ventilation or a liquid cooling system.

Figure 1A:
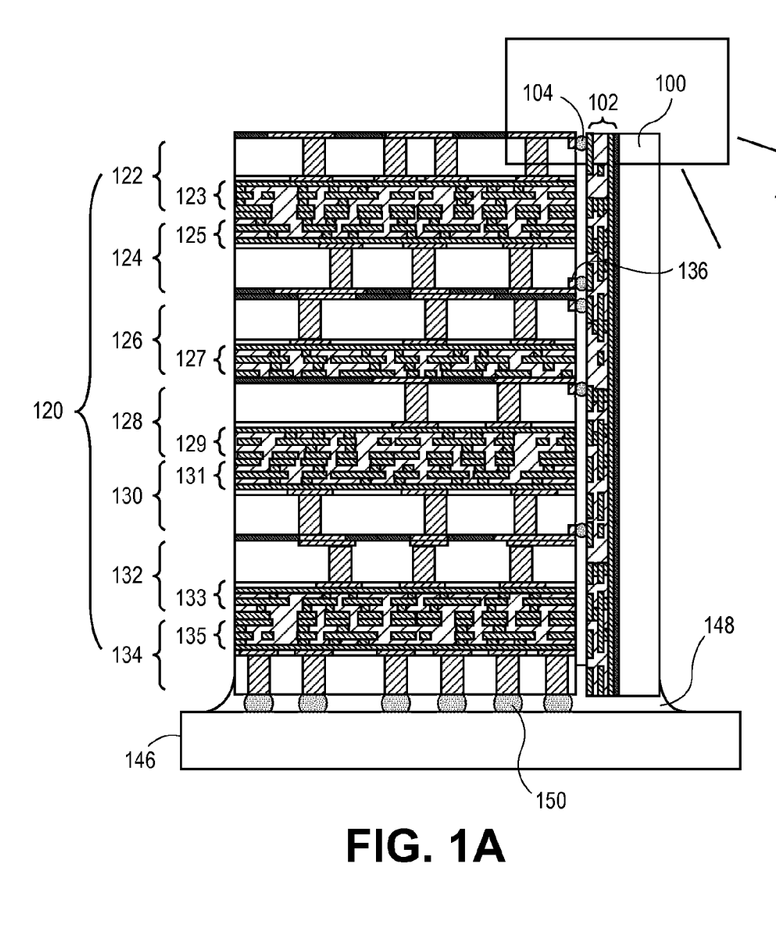
FIG. 1A illustrates a cross-sectional view of a packaged semiconductor multi-die structure having a vertical side chip, in accordance with an embodiment of the present invention.
Figure 1B:
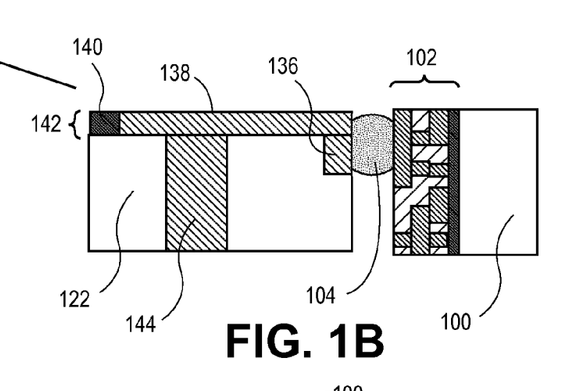
FIG. 1B is a magnified view of a portion of the structure of FIG. 1A.
Figure 1C:
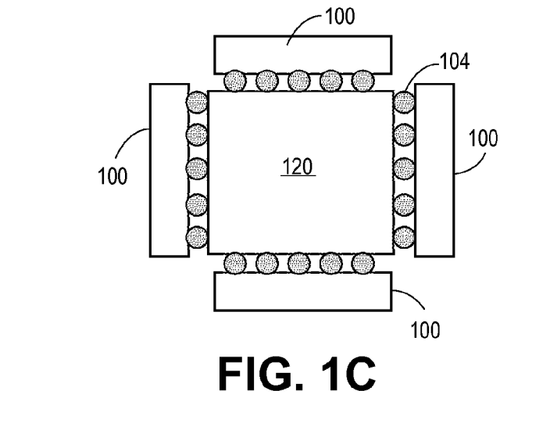
FIG. 1C is a top view of the structure of FIG. 1A.

In an embodiment, a 3D integrated packaging system with a vertical side chip (VSC) connected to a main stacked dies (MSD) structure enables high functionality and compact semiconductor system devices. For example, FIG. 1A illustrates a cross-sectional view of a packaged semiconductor multi-die structure having a vertical side chip, in accordance with one embodiment. FIG. 1B is a magnified view of a portion of the structure of FIG. 1A. FIG. 1C is a top view of the structure of FIG. 1A.

Referring to FIG. 1A and 1B, a 3D integrated packaging system includes a VSC 100 coupled to a main stacked dies (MSD) structure 120. Referring to FIG. 1C, more than one VSC 100 may be coupled to the MSD structure 120, e.g., four VSCs 100 are depicted in FIG. 1C. Each VSC 100 includes an active layer 102, such as a silicon active layer. One or more VSC interconnections 104, e.g., one or more solder bumps, couples each VSC 100 to the MSD structure 120. The MSD structure 120 may include a plurality of stacked dies in a substantially horizontal arrangement. For example, MSD structure 120 includes stacked dies 122, 124, 126, 128, 130, 132 and 134. Corresponding active layers 123, 125, 127, 129, 131, 133 and 135 are also shown. Die side pad structures, such as die side pad structure 136, of one or more of the stacked dies of the MSD structure 120 may be included for coupling with the VSC interconnections 104, as depicted in FIGS. 1A and 1B. Alternatively, or in conjunction with die side pad structure 136, die backside metal routing 138 of one or more of the stacked dies of the MSD structure 120 may be included for coupling with the VSC interconnections 104, as depicted in FIG. 1B. The die backside metal routing 138 may be included in a passivation layer 140 as part of a die backside metallization (DBM) layer 142, as is also depicted in FIG. 1B.

Referring again to FIG. 1B, the backside of one or more of stacked dies 122, 124, 126, 128, 130, 132 and 134 may include one or more through silicon vias (TSVs) 144. Furthermore, referring again to FIG. 1A, VSC 100 and MSD structure 120 may be disposed above a package substrate or motherboard 146 and the arrangement may include an intervening underfill material layer 148. The MSD structure 120 may be electrically coupled to the package substrate or motherboard 146 by, e.g., solder interconnections 150, as is also depicted in FIG. 1A. Package substrate or motherboard 146 may provide mechanical support and signal routing for attached integrated circuit devices. In one embodiment, package substrate or motherboard 146 is a multi-layer organic substrate. In another embodiment, package substrate or motherboard 146 is a ceramic substrate.

Overall, in accordance with an embodiment, the 3D integrated system of FIGS. 1A-1C includes one or more VSCs 100 coupled to a MSD structure 120 through vertical side chip interconnection 104, e.g., by solder bump diffusion or surface activated bonding (SAB). The silicon active layer 102 of VSCs 100 couple to silicon devices within the MSD structure 120 through one or both of die side pad (DSP) 136 or die backside metallization (DBM) layer 142 and, possibly, through silicon via (TSV) structures 144. In the case that a die side pad is not used, the metal layer 138 of the DBM layer 142 may be made thicker than typical to accommodate good overlap with VSC interconnections 104. In one embodiment, the dies within the MSD structure 120 are electrically coupled to one another through SAB at the corresponding active layers 123/125. In one embodiment, the dies of the MSD structure 120 are silicon dies such as, but not limited to, logic or memory based devices, e.g., processor, chipset, memory flash, sensor, optical and MEMS etc.

Figure 2A:
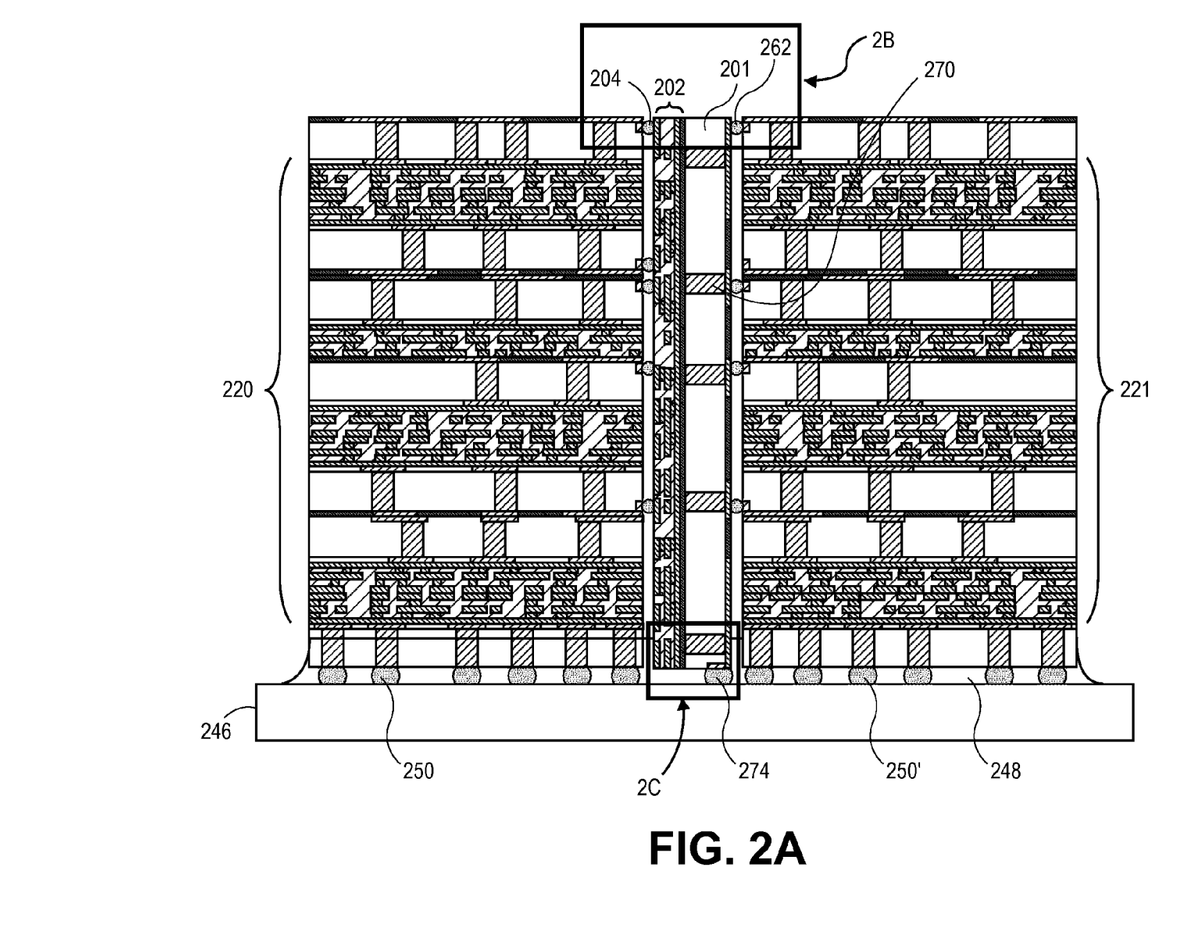
FIG. 2A illustrates a cross-sectional view of a packaged semiconductor multi-die structure having an intermediate vertical side chip, in accordance with another embodiment of the present invention.
Figure 2B:
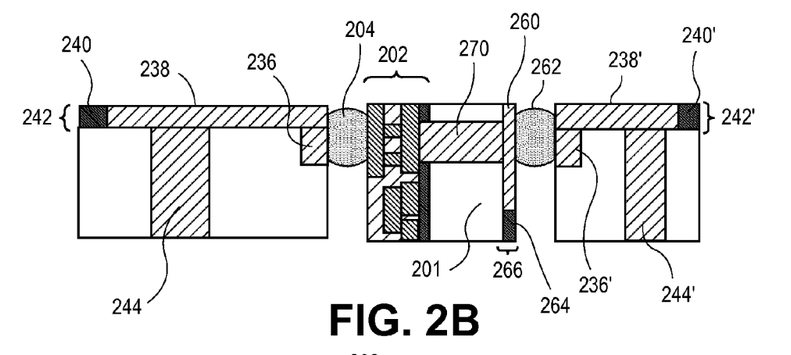
FIG. 2B is a magnified view of a portion of the structure of FIG. 2A.
Figure 2C:
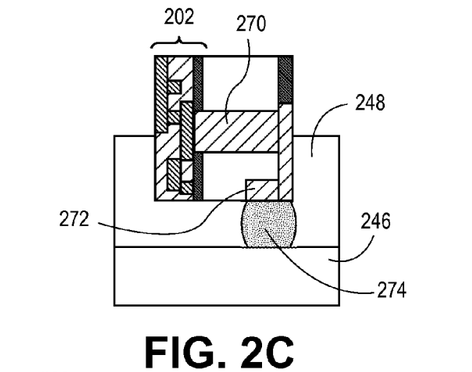
FIG. 2C is a magnified view of another portion of the structure of FIG. 2A.

In another embodiment, a higher level of system integration is achieved through use of an intermediate vertical side chip (i-VSC). For example, FIG. 2A illustrates a cross-sectional view of a packaged semiconductor multi-die structure having an intermediate vertical side chip, in accordance with one embodiment. FIG. 2B is a magnified view of a portion of the structure of FIG. 2A. FIG. 2C is a magnified view of another portion of the structure of FIG. 2A.

Figure 2D:
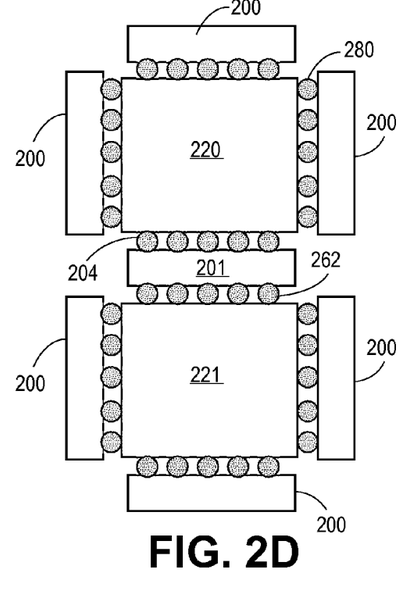
FIG. 2D is a top view of the structure of FIG. 2A, in accordance with an embodiment.
Figure 2E:
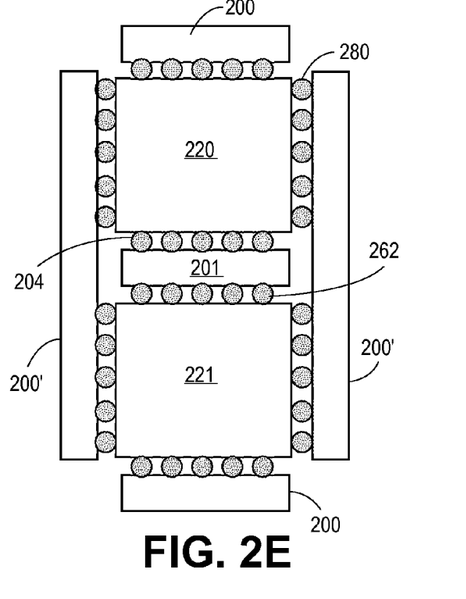
FIG. 2E is a top view of the structure of FIG. 2A, in accordance with another embodiment.

Referring to FIGS. 2A, 2B and 2C, a 3D integrated packaging system includes an intermediate vertical side chip (i-VSC) 201 coupled to two main stacked dies (MSD) structures 220 and 221. Referring to FIGS. 2D and 2E, additional VSCs 200 or 200' (e.g., non-intermediate VSCs) may be coupled to the MSD structures 220 and 221, as described in greater detail below. The i-VSC 201 includes an active layer 202, such as a silicon active layer. One or more VSC interconnections 204, e.g., one or more solder bumps, couples the active layer 202 of the i-VSC 201 to the MSD structure 220. The MSD structure 220 may include a plurality of stacked dies in a substantially horizontal arrangement. The i-VSC 201 also includes die backside metal routing 260. One or more VSC interconnections 262, e.g., one or more solder bumps, couples the die backside metal routing 260 of the i-VSC 201 to the MSD structure 221. The die backside metal routing 260 may be included in a passivation layer 264 as part of a die backside metallization (DBM) layer 266, as is depicted in FIG. 2B.

Die side pad structures, such as die side pad structure 236, of one or more of the stacked dies of the MSD structure 220 may be included for coupling with the i-VSC interconnections 204, as depicted in FIGS. 2A and 2B. Alternatively, or in conjunction with die side pad structure 236, die backside metal routing 238 of one or more of the stacked dies of the MSD structure 220 may be included for coupling with the i-VSC interconnections 204, as depicted in FIG. 2B. The die backside metal routing 238 may be included in a passivation layer 240 as part of a die backside metallization (DBM) layer 242, as is also depicted in FIG. 2B. Likewise, die side pad structures, such as die side pad structure 236', of one or more of the stacked dies of the MSD structure 221 may be included for coupling with the i-VSC interconnections 262, as depicted in FIGS. 2A and 2B. Alternatively, or in conjunction with die side pad structure 236', die backside metal routing 238' of one or more of the stacked dies of the MSD structure 221 may be included for coupling with the VSC interconnections 262, as depicted in FIG. 2B. The die backside metal routing 238' may be included in a passivation layer 240' as part of a die backside metallization (DBM) layer 242', as is also depicted in FIG. 2B. The MSD structures 221 and 220 may be electrically coupled to one another by one or more through silicon vias (TSVs) 270 included in the i-VSC 201, as depicted in FIGS. 2A, 2B and 2C.

Referring again to FIG. 2B, the backside of one or more of stacked dies of MSD structures 220 or 221 may include one or more through silicon vias (TSVs) 244 or 244'. Furthermore, referring again to FIG. 2A, i-VSC 201 and MSD structures 220 and 221 may be disposed above a package substrate or motherboard 246 and the arrangement may include an intervening underfill material layer 248. The MSD structures 220 and 221 may be electrically coupled to the package substrate or motherboard 246 by, e.g., solder interconnections 250 or 250', as is also depicted in FIG. 2A. Package substrate or motherboard 246 may provide mechanical support and signal routing for attached integrated circuit devices. In one embodiment, package substrate or motherboard 246 is a multi-layer organic substrate. In another embodiment, package substrate or motherboard 246 is a ceramic substrate.

Additionally, referring again to FIGS. 2A and 2C, the i-VSC 201 may include a die side pad structure 272. The i-VSC 201 may be electrically coupled to the package substrate or motherboard 246 by, e.g., a solder interconnection 274 and the die side pad structure 272, as depicted in FIGS. 2A and 2C.

As mentioned briefly above, referring to FIGS. 2D and 2E, additional VSCs 200 or 200' (e.g., non-intermediate VSCs) may be coupled to the MSD structures 220 and 221. FIG. 2D is a top view of the structure of FIG. 2A, in accordance with an embodiment. FIG. 2E is a top view of the structure of FIG. 2A, in accordance with another embodiment. Similar to the structure described in association with FIG. 1C, additional VSCs 200 can be included and coupled to the faces of MSD structures 220 and 221 not occupied by i-VSC 201. For example, FIG. 2D provides an example including six VSCs 200 in addition to the i-VSC 201. The VSCs 200 may be coupled to the MSD structures 220 or 221 by interconnections 280 in a fashion similar to that described in association with FIG. 1C. In another example, FIG. 2E provides an example including two regular or small size VSCs 200 and two large size VSCs 200', in addition to the i-VSC 201. The VSCs 200 and 200' may be coupled to the MSD structures 220 or 221 by interconnections 280 in a fashion similar to that described in association with FIG. 1C. It is to be understood that the structures of FIGS. 2D and 2E are exemplary and not intended to limit any of the numerous possible combinations of MSDs with iVSCs and VSCs to form a 3D multi-die structure.

In an embodiment, a process flow suitable for fabricating structures having DSPs to enable VSC and i-VSC interconnection is provided. For example, FIGS. 3A-3I illustrate various views of various operations in a method of fabricating a packaged semiconductor multi-die structure having one or more vertical side chips, including an intermediate side chip, in accordance with an embodiment of the present invention.

Figure 3A:
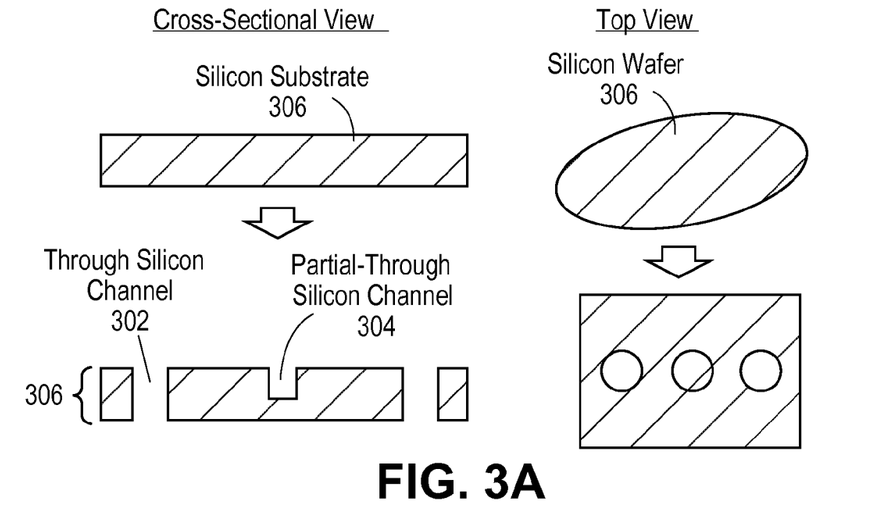
FIGS. 3A-3I illustrate various views of various operations in a method of fabricating a packaged semiconductor multi-die structure having one or more vertical side chips, including an intermediate side chip, in accordance with an embodiment of the present invention.
Figure 3B:
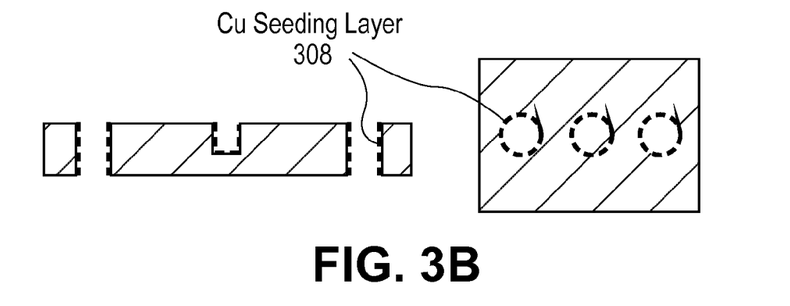
Figure 3C:
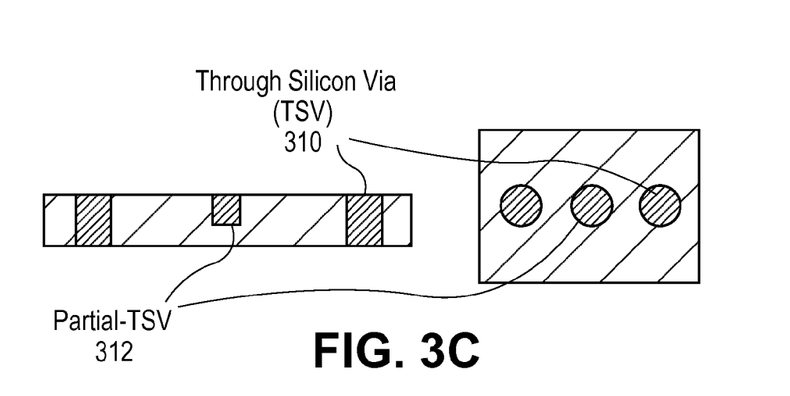

Referring to FIG. 3A, a wafer drilling process is used to form through 302 and partial-through 304 silicon channels in a silicon substrate or wafer 306 via, e.g., a laser or mechanical drilling process. An electro-less plating process may then be used to form a thin seeding layer 308 in the silicon channels of FIG. 3A, as depicted in FIG. 3B. Referring to FIG. 3C, an electrolytic plating process may be used to form through silicon vias 310 and partial through silicon vias 312, as depicted in FIG. 3C.

Figure 3D:
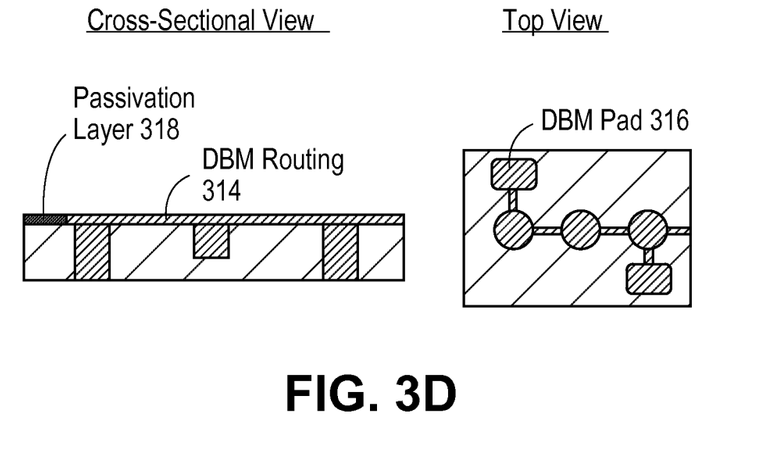
Figure 3E:
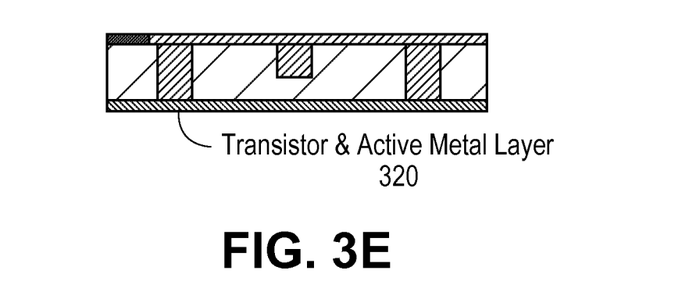

A die backside metallization (DBM) process may then be used to form a DBM layer which includes a die backside metal routing portion 314 and a die backside metal pad portion 316 in a passivation (insulation) layer 318, as depicted in FIG. 3D. Referring to FIG. 3E, a front-end-of-line (FEOL) wafer fabrication process may then be used to form a silicon active layer 320, such as a layer including transistors and metal layers and routing. Respective wafers formed by the process described in association with FIGS. 3A-3E may then be mechanically and electrically coupled to one another through, e.g., surface activated bonding (SAB) via wafer-level stacking process to provide a stack 322 of wafers 324, 326 and 328, as depicted in FIG. 3F.

Figure 3F:
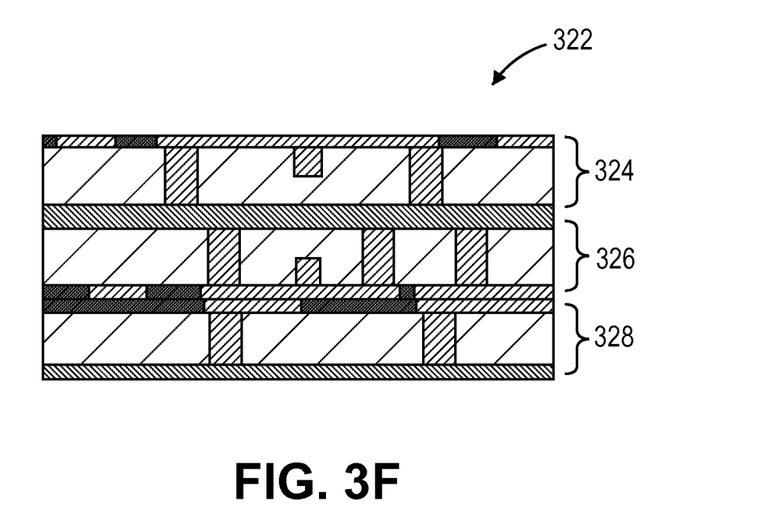
Figure 3G:
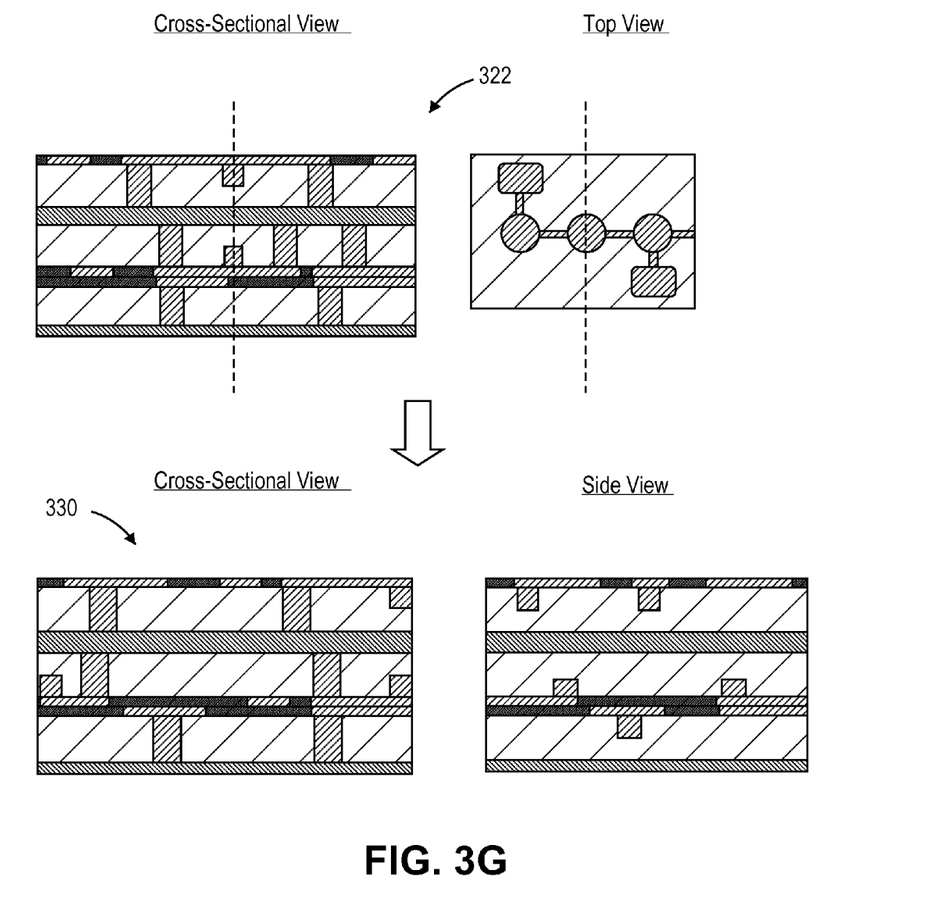
Figure 3H:
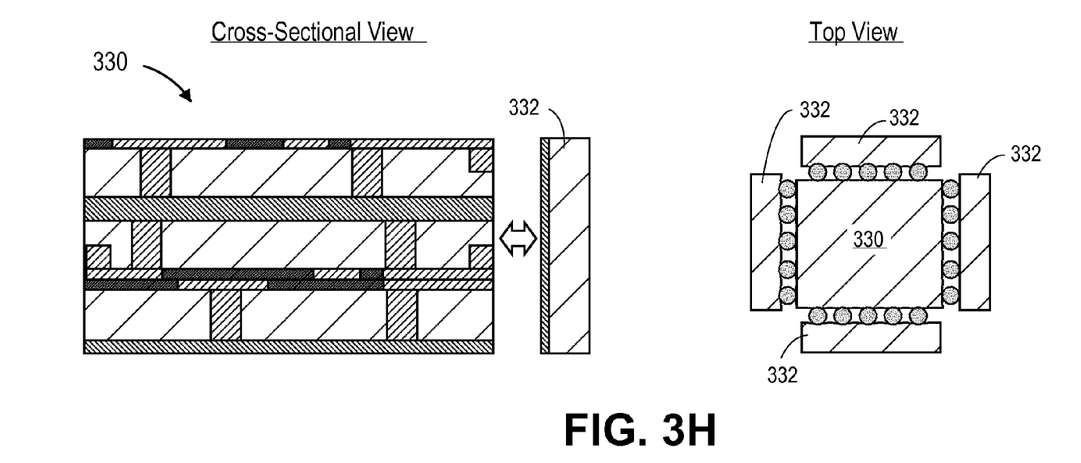
Figure 3I:
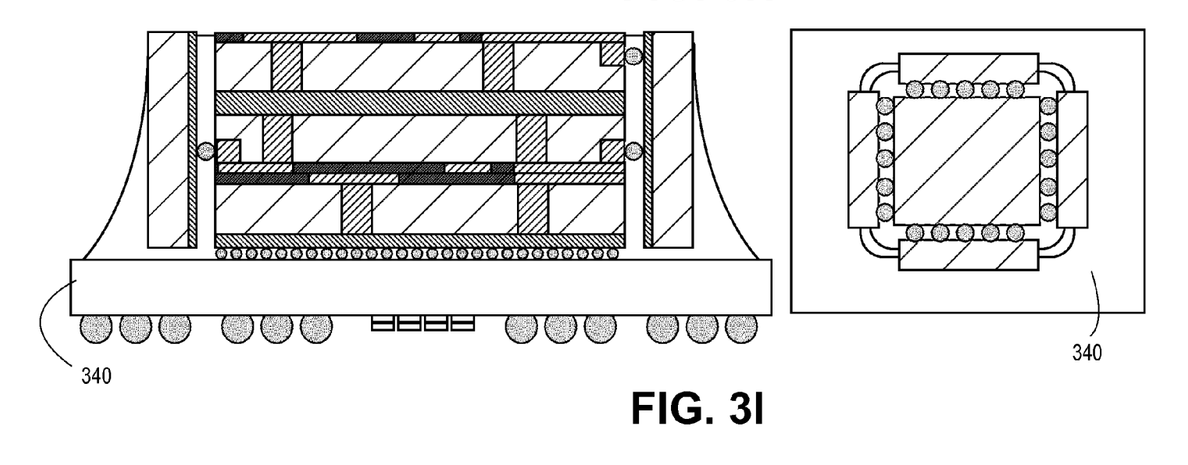

Referring to FIG. 3G, the stack 322 wafers of FIG. 3F are singulated to form individual MSD structures 330 through a stacked wafer dicing process. For example, high quality and precise stacked wafer dicing may be achieved through water laser-jet cutting technology or a mechanical sawing process. One or more VSC die 332 may then be electrically coupled to the MSD structure 330 by a vertical side chip attach process, as depicted in FIG. 3H. Referring to FIG. 3I, the structure of FIG. 3H is then surface mounted, e.g., by 3D chip to package/board attach, reflow, underfill and ball-attach process to a substrate or motherboard 340. It is to be understood that the above process operations may be performed in differing orders and may include fewer or more process operations than those described above.

Accordingly, one or more embodiments are directed to a 3D electronic semiconductor package including a main silicon die or a multiple stacked dies structure with die backside metallization and through silicon vias that interconnect with one or more vertical side chips. In an embodiment, one or more vertical side chips is connected to the multiple stacked dies structure through die side pad structures. In an embodiment, a die side pad fabrication method includes wafer drilling, e.g., laser or mechanical drilling, and an electroplating process, e.g., electroless and electrolytic plating to form a partial-silicon via metallization. In an embodiment, a wafer stacking and dicing process, e.g., water laser-jet or mechanical cutting, is used to singulate a stacked wafer into individual a multiple stacked dies structures by dicing through the partial-silicon via metallization region. In an embodiment, a vertical side chip attach and surface mounting process is used to assemble a 3D integrated package system.

Embodiments of the present invention may be used in the semiconductor fabrication and packaging industry for emerging business market segments such as, but not limited to, portable multimedia applications such as mobile internet devices (MIDs), personal digital assistants (PDAs), smart phones, digital cameras, etc. Embodiments may enable production of semiconductor system devices that meet end-user requirements for ultra-mobile digital handheld applications, e.g., high functionality and compact handheld gadgets with reduced system costs.

In addition to, or complimentary to, the above described embodiments, other embodiments may include packaging a semiconductor multi-die structure in one of a variety of other packaging options. One such option is housing a multi-die structure in a coreless substrate formed by a BBUL process. BBUL is a processor packaging technology that is bumpless since it does not use the usual small solder bumps to attach a die to the processor package wires. It has build-up layers since it is grown or built-up around the die, or multi-die structure. Some semiconductor packages now use a coreless substrate, which does not include the thick resin core layer commonly found in conventional substrates. In an embodiment, as part of the BBUL process, electrically conductive vias and routing layers are formed above an active side of the semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, a substrate is a coreless substrate since a panel is used to support packaging of a semiconductor multi-die structure through to formation of an array of external conductive conducts. The panel is then removed to provide a coreless package for the semiconductor multi-die structure. Accordingly, in an embodiment, the term "coreless" is used to mean that the support upon which the package was formed for housing a multi-die structure is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

A packaged semiconductor multi-die structure may, in an embodiment, be a fully embedded and surrounded semiconductor multi-die structure. As used in this disclosure, "fully embedded and surrounded" means that all surfaces of the semiconductor multi-die structure are in contact with an encapsulating film (such as a dielectric layer) of substrate, or at least in contact with a material housed within the encapsulating film. Said another way, "fully embedded and surrounded" means that all exposed surfaces of the semiconductor multi-die structure are in contact with the encapsulating film of a substrate.

A packaged semiconductor multi-die structure may, in an embodiment, be a fully embedded semiconductor multi-die structure. As used in this disclosure, "fully embedded" means that an active surface and the entire sidewalls of the semiconductor multi-die structure are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the last semiconductor die of the multi-die structure are in contact with the encapsulating film of a substrate. However, in such cases, the semiconductor multi-die structure is not "surrounded" since the backside of the last semiconductor die is not in contact with an encapsulating film of the substrate or with a material housed within the encapsulating film. In a first embodiment, a back surface of the last semiconductor die protrudes from the global planarity surface of the die side of a substrate. In a second embodiment, no surface of the last semiconductor die protrudes from the global planarity surface of the die side of a substrate.

In contrast to the above definitions of "fully embedded and surrounded" and "fully embedded," a "partially embedded" multi-die structure is a structure with a last die having an entire surface, but only a portion of the sidewalls, in contact with an encapsulating film of a substrate (such as a coreless substrate), or at least in contact with a material housed within the encapsulating film. In further contrast, a "non-embedded" multi-die structure has a last die having at most one surface, and no portion of the sidewalls, in contact with an encapsulating film of a substrate (such as a coreless substrate), or in contact with a material housed within the encapsulating film.

In an embodiment, a substrate includes an encapsulant layer. In an embodiment, a semiconductor package for housing a multi-die semiconductor structure having an intermediate vertical side chip includes a foundation substrate at the land side of the substrate. For example, where the semiconductor multi-die structure is part of a hand-held device such as a smart phone embodiment or a hand-held reader embodiment, the foundation substrate may be a motherboard, an external shell such as the portion an individual touches during use, or both the motherboard and an external shell such as the portion an individual touches during use.

In another aspect, a semiconductor package for housing a multi-die semiconductor structure having an intermediate vertical side chip includes the multi-die structure in a core of a substrate. In one such embodiment, the multi-die semiconductor structure is embedded within a single same core material. The packaging processes may, in an embodiment, be performed on a carrier. A carrier, such as a panel, may be provided having a plurality of cavities disposed therein, each sized to receive a semiconductor multi-die structure. During processing, identical structures may be mated in order to build a back-to-back apparatus for processing utility. Consequently, processing throughput is effectively doubled.

For example, a panel may include 1000 recesses on either side, allowing for fabrication of 2000 individual packages from a single panel. The panel may include an adhesion release layer and an adhesive binder. A cutting zone may be provided at each end of the apparatus for separation processing. A backside of a multi-die structure may be bonded to the panel with a die-bonding film. Encapsulating layers may be formed by a lamination process. In another embodiment, one or more encapsulation layers may be formed by spinning on and curing a dielectric upon a wafer-scale array of apparatuses.

In an embodiment, one or more of the above described semiconductor packages housing a multi-die structure is paired with other packages following the packaging process. In an example, connections between two or more individually packaged multi-die structures may be made post BBUL fabrication by using thermal compression bonding (TCB) processing.

Figure 4:
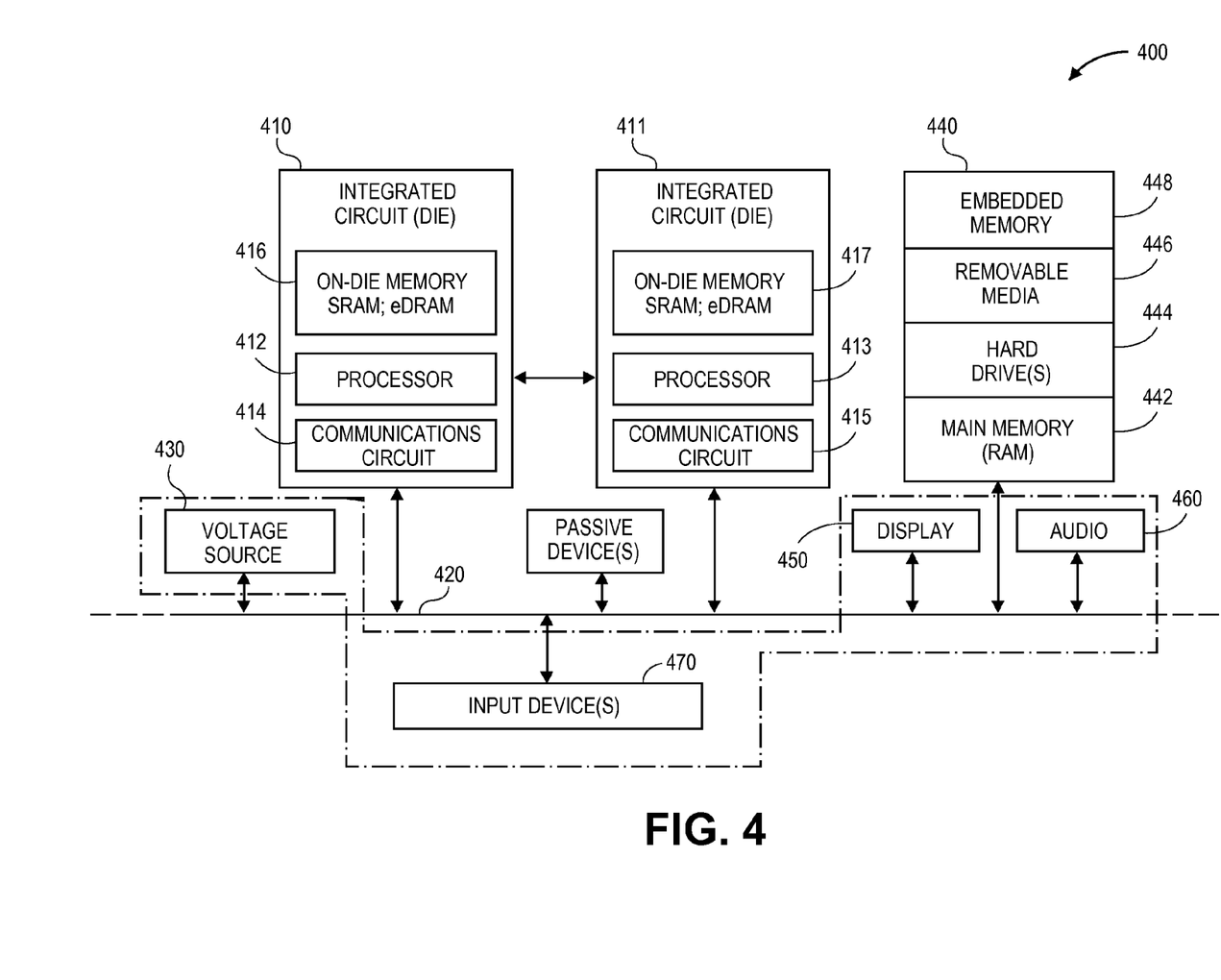
FIG. 4 is a schematic of a computer system, in accordance with an embodiment of the present invention.

FIG. 4 is a schematic of a computer system 400, in accordance with an embodiment of the present invention. The computer system 400 (also referred to as the electronic system 400) as depicted can embody a semiconductor multi-die structure having an intermediate vertical side chip according to any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes a semiconductor multi-die structure having an intermediate vertical side chip, as disclosed herein. In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 410 includes on-die memory 416 such as static random-access memory (SRAM). In an embodiment, the processor 410 includes embedded on-die memory 416 such as embedded dynamic random-access memory (eDRAM).

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in an embedded TSV die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a semiconductor multi-die structure having an intermediate vertical side chip according to any of the several disclosed embodiments and their equivalents, an electronic system, a computer system, one or more methods of fabricating an integrated circuit, and one or more methods of fabricating an electronic assembly that includes a semiconductor multi-die structure having an intermediate vertical side chip according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor multi-die structure having an intermediate vertical side chip embodiments and their equivalents. A foundation substrate may also be included, as represented by the dashed line of FIG. 4. Passive devices may also be included, an option also depicted in FIG. 4.

Embodiments of the present invention include semiconductor multi-die structures having intermediate vertical side chips, and packages housing such semiconductor multi-die structures.

In an embodiment, a multi-die semiconductor structure includes a first main stacked dies (MSD) structure having a first substantially horizontal arrangement of semiconductor dies. A second MSD structure having a second substantially horizontal arrangement of semiconductor dies is also included. An intermediate vertical side chip (i-VSC) is disposed between and electrically coupled to the first and second MSD structures.

In one embodiment, the i-VSC is coupled to the first MSD structure via one or more front interconnections of the i-VSC, the front interconnections being disposed on an active side of the i-VSC.

In one embodiment, a front interconnection of the i-VSC is coupled to the first MSD structure via a die side pad (DSP) of the first MSD structure.

In one embodiment, a front interconnection of the i-VSC is coupled to the first MSD structure via an end of metal routing of a die in the first MSD structure.

In one embodiment, the i-VSC is coupled to the second MSD structure via die backside metallization (DBM) of the i-VSC.

In one embodiment, the DBM of the i-VSC is coupled to the second MSD structure via a DSP of the second MSD structure.

In one embodiment, the DBM of the i-VSC is coupled to the second MSD structure via an end of metal routing of a die in the second MSD structure.

In one embodiment, the i-VSC electrically couples the first and second MSD structures via one or more through silicon vias (TSVs) of the i-VSC.

In one embodiment, the i-VSC is coupled to the first MSD structure via one or more front interconnections of the i-VSC and a DSP of the first MSD structure, the i-VSC is coupled to the second MSD structure via DBM of the i-VSC and a DSP of the second MSD structure, and the i-VSC electrically couples the first and second MSD structures via one or more through silicon vias (TSVs) of the i-VSC.

In an embodiment, a semiconductor package includes a substrate. A first main stacked dies (MSD) structure having a first substantially horizontal arrangement of semiconductor dies is interconnected to the substrate. A second MSD structure having a second substantially horizontal arrangement of semiconductor dies is interconnected to the substrate. An intermediate vertical side chip (i-VSC) is disposed between and electrically coupled to the first and second MSD structures. The i-VSC is also interconnected to the substrate. An underfill material is disposed between the substrate and the first and second MSD structures, and between the substrate and the i-VSC.

In one embodiment, the i-VSC is interconnected to the substrate via a die side pad (DSP) of the i-VSC.

In one embodiment, the i-VSC is coupled to the first MSD structure via one or more front interconnections of the i-VSC, the front interconnections being disposed on an active side of the i-VSC.

In one embodiment, a front interconnection of the i-VSC is coupled to the first MSD structure via a DSP of the first MSD structure.

In one embodiment, a front interconnection of the i-VSC is coupled to the first MSD structure via an end of metal routing of a die in the first MSD structure.

In one embodiment, the i-VSC is coupled to the second MSD structure via die backside metallization (DBM) of the i-VSC.

In one embodiment, the DBM of the i-VSC is coupled to the second MSD structure via a DSP of the second MSD structure.

In one embodiment, the DBM of the i-VSC is coupled to the second MSD structure via an end of metal routing of a die in the second MSD structure.

In one embodiment, the i-VSC electrically couples the first and second MSD structures via one or more through silicon vias (TSVs) of the i-VSC.

In one embodiment, the i-VSC is coupled to the first MSD structure via one or more front interconnections of the i-VSC and a DSP of the first MSD structure, the i-VSC is coupled to the second MSD structure via DBM of the i-VSC and a DSP of the second MSD structure, and the i-VSC electrically couples the first and second MSD structures via one or more through silicon vias (TSVs) of the i-VSC.

In an embodiment, a semiconductor package includes a substrate. A first main stacked dies (MSD) structure having a first substantially horizontal arrangement of semiconductor dies is interconnected to the substrate. A second MSD structure having a second substantially horizontal arrangement of semiconductor dies is interconnected to the substrate. An intermediate vertical side chip (i-VSC) is disposed between and electrically coupled to the first and second MSD structures. The i-VSC is also interconnected to the substrate. One or more vertical side chips (VSCs) is disposed adjacent to and electrically coupled to one or both of the first and second MSD structures. However, the one or more VSCs is interconnected to the substrate. An underfill material is disposed between the substrate and the first and second MSD structures, between the substrate and the i-VSC, and between the substrate and the one or more VSCs.

In one embodiment, the one or more VSCs includes three VSCs coupled to the first MSD structure but not the second MSD structure, and includes three VSCs coupled to the second MSD structure but not the first MSD structure.

In one embodiment, the one or more VSCs includes one VSC coupled to the first MSD structure but not the second MSD structure, includes one VSC coupled to the second MSD structure but not the first MSD structure, and includes two VSCs each coupled to both the first and second MSD structures.

In one embodiment, the i-VSC is interconnected to the substrate via a die side pad (DSP) of the i-VSC.

In one embodiment, the i-VSC is coupled to the first MSD structure via one or more front interconnections of the i-VSC, the front interconnections being disposed on an active side of the i-VSC.

In one embodiment, a front interconnection of the i-VSC is coupled to the first MSD structure via a DSP of the first MSD structure.

In one embodiment, a front interconnection of the i-VSC is coupled to the first MSD structure via an end of metal routing of a die in the first MSD structure.

In one embodiment, the i-VSC is coupled to the second MSD structure via die backside metallization (DBM) of the i-VSC.

In one embodiment, the DBM of the i-VSC is coupled to the second MSD structure via a DSP of the second MSD structure.

In one embodiment, the DBM of the i-VSC is coupled to the second MSD structure via an end of metal routing of a die in the second MSD structure.

In one embodiment, the i-VSC electrically couples the first and second MSD structures via one or more through silicon vias (TSVs) of the i-VSC.

What is claimed is:

1. A multi-die semiconductor structure, comprising:
  a first main stacked dies (MSD) structure comprising a first substantially horizontal arrangement of semiconductor dies;
  a second MSD structure comprising a second substantially horizontal arrangement of semiconductor dies; and
  an intermediate vertical side chip (i-VSC) disposed between and electrically coupled to the first and second MSD structures.

2. The multi-die semiconductor structure of claim 1, wherein the i-VSC is coupled to the first MSD structure via one or more front interconnections of the i-VSC, the front interconnections disposed on an active side of the i-VSC.

3. The multi-die semiconductor structure of claim 2, wherein a front interconnection of the i-VSC is coupled to the first MSD structure via a die side pad (DSP) of the first MSD structure.

4. The multi-die semiconductor structure of claim 2, wherein a front interconnection of the i-VSC is coupled to the first MSD structure via an end of metal routing of a die in the first MSD structure.

5. The multi-die semiconductor structure of claim 1, wherein the i-VSC is coupled to the second MSD structure via die backside metallization (DBM) of the i-VSC.

6. The multi-die semiconductor structure of claim 5, wherein the DBM of the i-VSC is coupled to the second MSD structure via a DSP of the second MSD structure.

7. The multi-die semiconductor structure of claim 5, wherein the DBM of the i-VSC is coupled to the second MSD structure via an end of metal routing of a die in the second MSD structure.

8. The multi-die semiconductor structure of claim 1, wherein the i-VSC electrically couples the first and second MSD structures via one or more through silicon vias (TSVs) of the i-VSC.

9. The multi-die semiconductor structure of claim 1, wherein the i-VSC is coupled to the first MSD structure via one or more front interconnections of the i-VSC and a DSP of the first MSD structure, the i-VSC is coupled to the second MSD structure via DBM of the i-VSC and a DSP of the second MSD structure, and the i-VSC electrically couples the first and second MSD structures via one or more through silicon vias (TSVs) of the i-VSC.

10. A semiconductor package, comprising:
  a substrate;
  a first main stacked dies (MSD) structure comprising a first substantially horizontal arrangement of semiconductor dies interconnected to the substrate;
  a second MSD structure comprising a second substantially horizontal arrangement of semiconductor dies interconnected to the substrate;
  an intermediate vertical side chip (i-VSC) disposed between and electrically coupled to the first and second MSD structures, the i-VSC interconnected to the substrate; and an underfill material disposed between the substrate and the first and second MSD structures, and between the substrate and the i-VSC.

11. The semiconductor package of claim 10, wherein the i-VSC is interconnected to the substrate via a die side pad (DSP) of the i-VSC.

12. The semiconductor package of claim 10, wherein the i-VSC is coupled to the first MSD structure via one or more front interconnections of the i-VSC, the front interconnections disposed on an active side of the i-VSC.

13. The semiconductor package of claim 12, wherein a front interconnection of the i-VSC is coupled to the first MSD structure via a DSP of the first MSD structure.

14. The semiconductor package of claim 12, wherein a front interconnection of the i-VSC is coupled to the first MSD structure via an end of metal routing of a die in the first MSD structure.

15. The semiconductor package of claim 10, wherein the i-VSC is coupled to the second MSD structure via die backside metallization (DBM) of the i-VSC.

16. The semiconductor package of claim 15, wherein the DBM of the i-VSC is coupled to the second MSD structure via a DSP of the second MSD structure.

17. The semiconductor package of claim 15, wherein the DBM of the i-VSC is coupled to the second MSD structure via an end of metal routing of a die in the second MSD structure.

18. The semiconductor package of claim 10, wherein the i-VSC electrically couples the first and second MSD structures via one or more through silicon vias (TSVs) of the i-VSC.

19. The semiconductor package of claim 10, wherein the i-VSC is coupled to the first MSD structure via one or more front interconnections of the i-VSC and a DSP of the first MSD structure, the i-VSC is coupled to the second MSD structure via DBM of the i-VSC and a DSP of the second MSD structure, and the i-VSC electrically couples the first and second MSD structures via one or more through silicon vias (TSVs) of the i-VSC.

20. A semiconductor package, comprising:
a substrate;
a first main stacked dies (MSD) structure comprising a first substantially horizontal arrangement of semiconductor dies interconnected to the substrate;
a second MSD structure comprising a second substantially horizontal arrangement of semiconductor dies interconnected to the substrate;
an intermediate vertical side chip (i-VSC) disposed between and electrically coupled to the first and second MSD structures, the i-VSC interconnected to the substrate;
one or more vertical side chips (VSCs) disposed adjacent to and electrically coupled to one or both of the first and second MSD structures, but not interconnected to the substrate; and
an underfill material disposed between the substrate and the first and second MSD structures, between the substrate and the i-VSC, and between the substrate and the one or more VSCs.

21. The semiconductor package of claim 20, wherein the one or more VSCs comprises three VSCs coupled to the first MSD structure but not the second MSD structure, and comprises three VSCs coupled to the second MSD structure but not the first MSD structure.

22. The semiconductor package of claim 20, wherein the one or more VSCs comprises one VSC coupled to the first MSD structure but not the second MSD structure, comprises one VSC coupled to the second MSD structure but not the first MSD structure, and comprises two VSCs each coupled to both the first and second MSD structures.

23. The semiconductor package of claim 20, wherein the i-VSC is interconnected to the substrate via a die side pad (DSP) of the i-VSC.

24. The semiconductor package of claim 20, wherein the i-VSC is coupled to the first MSD structure via one or more front interconnections of the i-VSC, the front interconnections disposed on an active side of the i-VSC.

25. The semiconductor package of claim 24, wherein a front interconnection of the i-VSC is coupled to the first MSD structure via a DSP of the first MSD structure.

26. The semiconductor package of claim 24, wherein a front interconnection of the i-VSC is coupled to the first MSD structure via an end of metal routing of a die in the first MSD structure.

27. The semiconductor package of claim 20, wherein the i-VSC is coupled to the second MSD structure via die backside metallization (DBM) of the i-VSC.

28. The semiconductor package of claim 27, wherein the DBM of the i-VSC is coupled to the second MSD structure via a DSP of the second MSD structure.

29. The semiconductor package of claim 27, wherein the DBM of the i-VSC is coupled to the second MSD structure via an end of metal routing of a die in the second MSD structure.

30. The semiconductor package of claim 20, wherein the i-VSC electrically couples the first and second MSD structures via one or more through silicon vias (TSVs) of the i-VSC.

* * * * *